United States Patent [19]

Berlin

[11] 4,132,928
[45] Jan. 2, 1979

[54] DEVICE FOR IDENTIFYING WAVEFORMS IN A MULTIPLE OSCILLOSCOPE DISPLAY

[75] Inventor: Howard M. Berlin, Wilmington, Del.

[73] Assignee: The United States of America as represented by the Secretary of the Army, Washington, D.C.

[21] Appl. No.: 791,754

[22] Filed: Apr. 28, 1977

[51] Int. Cl.² .......................................... G01R 13/30
[52] U.S. Cl. ................................................... 315/377
[58] Field of Search ................. 315/30, 377, 379, 383; 358/219; 324/121, 183; 307/264; 328/187, 189

[56] References Cited

U.S. PATENT DOCUMENTS 3,449,671  6/1969  Long ...................................... 324/121

FOREIGN PATENT DOCUMENTS 1962773  6/1971  Fed. Rep. of Germany ........... 324/121

OTHER PUBLICATIONS

Marsters et al., Simple Ckt. for Obtaining Rastered Oscillope Displays on Tek. Oscilloscopes, Review of Sci. Inst's., vol. 38, No. 2, Feb. 1967.
Penfold, New Transistorized Oscillope, Radio & Electronics Constructor, vol. 29, No. 3, pp. 154-160, Oct. 1975.

Primary Examiner—Theodore M. Blum
Attorney, Agent, or Firm—Nathan Edelberg; Harold H. Card, Jr.; A. Victor Erkkila

[57] ABSTRACT

A new device for rapid identification of two or more analog signals simultaneously displayed upon an oscilloscope.

1 Claim, 2 Drawing Figures

DEVICE FOR IDENTIFYING WAVEFORMS IN A MULTIPLE OSCILLOSCOPE DISPLAY

DEDICATION CLAUSE

The invention described herein may be manufactured and used by or for the United States Government for governmental purposes without the payment of any royalties thereon or therefor.

BACKGROUND OF THE INVENTION

In the past, insofar as known, no simple device has been known or used to enable two or more analog signals to be displayed simultaneously upon a plural channel oscilloscope whereby easy discernment or distinction is had. One known technique has been to increase the intensity of one or more of the signals. Hence, it has been a constant problem for those using an oscilloscope to compare various waveforms. This is especially so when the various waveforms are similar in shape and/or fluctuate.

My invention device was conceived and reduced to practice to solve the above described problems and to satisfy the long-felt need of making waveforms readily distinguishable on a scope or tube. My invention adapts itself to any multichannel oscilloscope.

SUMMARY OF INVENTION

Briefly, my invention is a circuit that can be interposed as an interface unit between the output of plural signal producing means and the input of multichannel oscilloscope. It enables two or more analog signals referenced to a common base line to be simultaneously displayed on an oscilloscope. My device enables one to add dotted or dashed line markers to the one or more incoming analog signals. My invention device uses a type 555 integrated circuit timer, connected to function as a "square wave generator" or "astable multivibrator." A second signal would then appear on the scope in a dotted or dashed fashion in contrast to a solid line type first signal.

A principal object of my invention is to provide a device which can be adapted to any multichannel oscilloscope to facilitate easy signal differentiation when plural signals are fed thereto.

Another object of my invention is to provide a device which can be adapted to any multichannel oscilloscope to facilitate distinguishing plural signals by imposing changes to at least one thereof.

A further object of my invention is to provide a device which can be adapted to any multichannel oscilloscope to facilitate differentiation of plural signals by imposing dotted or dashed line markers to at least one thereof.

Other objects will become more apparent after considering the following description of the invention in conjunction with the accompanying drawings.

DESCRIPTION OF MY INVENTION

Figure 1:
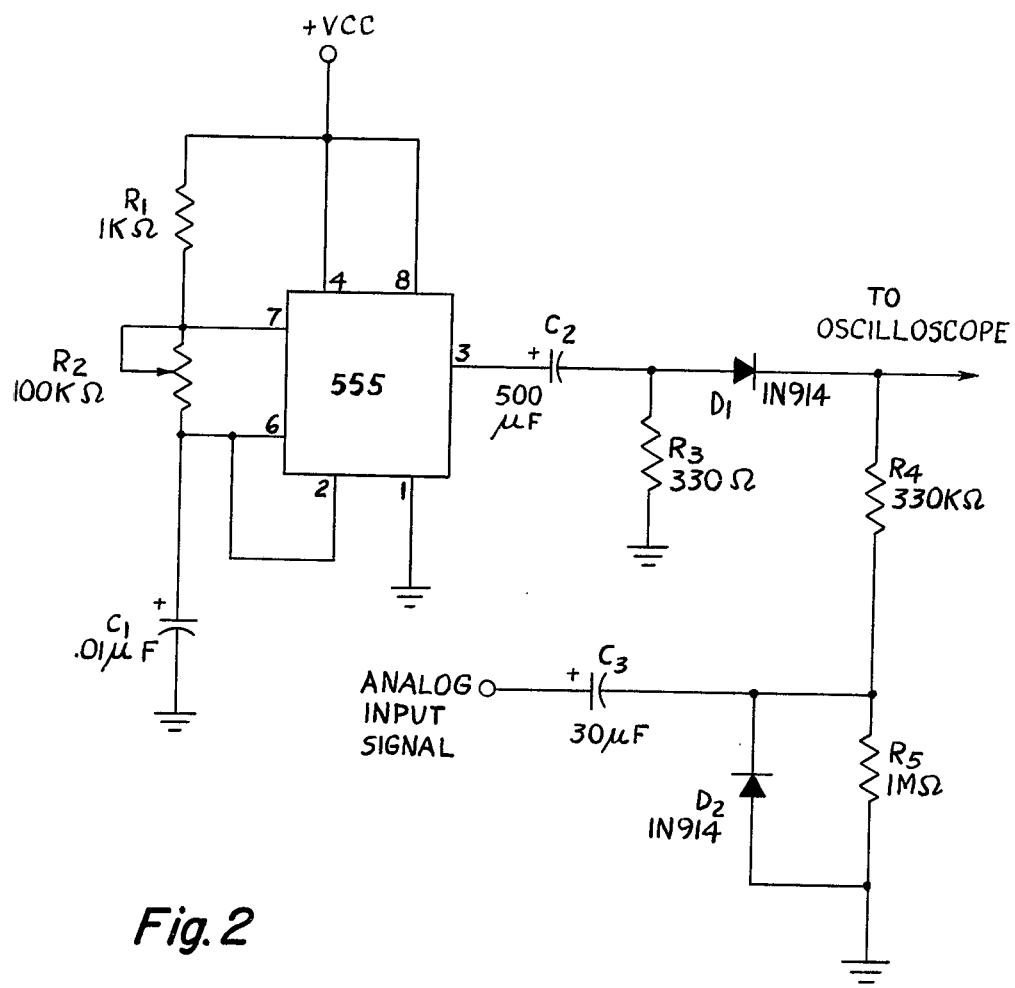
FIG. 1 depicts a circuit diagram of my invention device.
Figure 2:
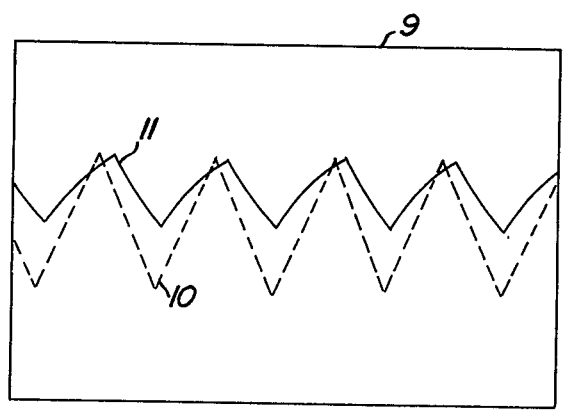
FIG. 2 depicts an example of the results of my invention whereby plural signals are distinguished.

The heart of my new device for imposing a dotted or dashed marker 10, as shown in FIG. 2, is type 555 integrated circuit timer so designated in FIG. 1 with necessary components associated therewith to be described below. Any conventional chasis can be provided for my invention. My device will work best if appropriate anti-interference measures are taken. That is, shielded cable from my invention to the signal device not shown and, so also, to the oscilloscope, not shown, is advisable. Basically, my invention depicted in FIG. 1 is a square wave generator connected to timer 555. The frequency of the generator is determined by $R_1$ which is 1000 ohms, $R_2$ which is 100,000 ohms and capacitor $C_1$ which is 0.01 microfarads. These relationships are derived by the use of this formula where $f$ is the frequency. The formula is:

$$f = \frac{1.443}{(R_1 + 2R_2)C_1} \text{ in Hz}$$

In other words, timer 555 and components $R_1$, $R_2$ and C, comprise the generator or astable multivibrator. $R_2$ is a variable resistor which functions to vary the frequency of the square wave. That is, it is the frequency control. Terminals 4 and 8 of 555 are tied together to prevent resetting. Terminals 2 and 6 are tied together to change the device from a single shot operation to the square wave operation. The square wave, as it leaves the generator at terminal 3 of timer 555, is stripped of its direct current component by $C_2$ the 500 micorfarad capacitor. This then causes the square wave to be centered at ground potential. $R_3$, in this instant, serves as load for $C_2$ and is determined empirically. Diode $D_1$ which is an 1N914 type functions to isolate the signal input from the generator portion aforementioned.

The input signal designated here as analog input signal first passes through the 30 microfarad capacitor $C_3$ to block out all direct current. $D_2$ which is also an 1N914, functions to further isolate the sections; however, it could be eliminated and the device would function marginally. $R_5$ here chosen to be 1 million ohms is tied to ground and functions as a load to the input signal which contemporaneously functions as a voltage divided in conjunction with $R_4$ of 330 thousands of ohms.

In operation, an input signal, to be distinguished from solid signal 11 as depicted on the screen in FIG. 2, and depicted as 10 is fed the device at the input (analog input signal). Contemporaneous thereto, the square wave signal from the generator which must be at least 5 to 10 times greater than the analog signal frequency, is fed to the oscilloscope. It is noted that the supply voltage VCC must be positive and be greater than the peak to peak voltage of the analog input signal, i.e., it can range from 4.5 to 16 volts d.c. My circuit can handle input signals having peak to peak voltages of 1 volt without distortion. The square wave generator signal is then superimposed upon the analog input signal. The scope's trace position at any instant is determined by the sum of voltages across $R_4$ and $R_5$. When the square wave across $R_4$ is not zero, it drives the trace off the screen. The fast rise and fall of the pulse created by the generator cannot be seen at normal scope intensity. Hence, this accounts for the dots or dashes on the scope trace. The number of dots or dashes in each analog signal is determined by varying $R_2$. That is, the number of times the frequency of the generator exceeds that of the analog input signal determines the number of dots and dashes per analog input signal.

My invention can be made in the form of a plug adaptor with all the components of FIG. 1 disposed therein.

Also, my invention can be battery driven and made portable. Also, if three or more traces or analog input signals are to be viewed contemporaneously, plural companion circuits like those of FIG. 1 can be used. If one desires three or more traces upon a multichannel oscilloscope, this can be easily achieved with my invention. One only need use a like number of companion circuits of FIG. 1. It is noted, of course, that the various traces could be distinguished by varying the number of dots and dashs per analog signal. This can be done by varying $R_2$. If $R_2$ cannot give the frequency range desired for such flexibility, then calculation and changing the values of $R_2$, $R_3$ and $C_1$ in accord with the formula aforementioned will achieve that end.

Other modifications will occur to one skilled in the art and be within the realm of my invention concept.

I claim:

1. An electronic device for visually distinguishing differences between plural traces representing plural input signals on a multichannel oscilloscope comprising:
   at least one 555 integrated circuit used as a square wave generator adapted to be coupled with said multichannel oscilloscope and have an additive signal effect on at least one of said plural input signals and cause it to appear on said oscilloscope as a signal trace with dots or dashes and be distinguishable from the other of said plural traces,
   wherein the frequency of said generator is greater than said input signal to create said dots or dashes, and wherein diodes are used to isolate a portion of the input signal from said generator.

* * * * *